(12) United States Patent
Tokuhiro

(10) Patent No.: US 9,437,261 B2
(45) Date of Patent: Sep. 6, 2016

(54) MEMORY CONTROLLER AND INFORMATION PROCESSING DEVICE

(71) Applicant: FUJITSU LIMITED, Kawasaki-shi, Kanagawa (JP)

(72) Inventor: Noriyuki Tokuhiro, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 22 days.

(21) Appl. No.: 14/599,110

(22) Filed: Jan. 16, 2015

(65) Prior Publication Data

US 2015/0213875 A1 Jul. 30, 2015

(30) Foreign Application Priority Data

Jan. 24, 2014 (JP) .................. 2014-011071

(51) Int. Cl.
*G11C 7/10* (2006.01)
(52) U.S. Cl.
CPC .................. *G11C 7/1072* (2013.01)
(58) Field of Classification Search
CPC ............ G11C 11/4076; G11C 7/1066; G11C 7/1072; G11C 2207/2254; G11C 7/22; G11C 7/222; G11C 7/225; G11C 29/022; G11C 7/1063; G11C 7/1078; G11C 7/1093; G06F 13/1689; G06F 13/4243; G06F 2213/0038; H04L 7/0008; H04L 7/0033; H04L 7/0037

See application file for complete search history.

(56) References Cited

U.S. PATENT DOCUMENTS

| | | | |
|---|---|---|---|
| 2007/0262800 A1* | 11/2007 | Awaji ................. | G01R 31/3016 327/164 |
| 2007/0291830 A1* | 12/2007 | Hori ....................... | G11C 29/56 375/220 |
| 2010/0124131 A1 | 5/2010 | Onishi | |
| 2012/0140584 A1* | 6/2012 | Kwon ................. | G11C 7/1063 365/193 |
| 2012/0242385 A1 | 9/2012 | Tokuhiro | |
| 2015/0213878 A1* | 7/2015 | Hashimoto ......... | G11C 11/4099 711/106 |

FOREIGN PATENT DOCUMENTS

| | | |
|---|---|---|
| JP | 2010-122842 | 6/2010 |
| WO | 2011-077573 | 6/2011 |

* cited by examiner

*Primary Examiner* — Zhuo Li
(74) *Attorney, Agent, or Firm* — Fujitsu Patent Center

(57) ABSTRACT

A memory controller has a first variable delay circuit that delays a data strobe signal received from a memory, and a second variable delay circuit that variably delays a data signal which is received from the memory and is synchronous with the data strobe signal, and that is set a second delay amount which is different from a first delay amount of the first variable delay circuit.

8 Claims, 13 Drawing Sheets

FIG. 13
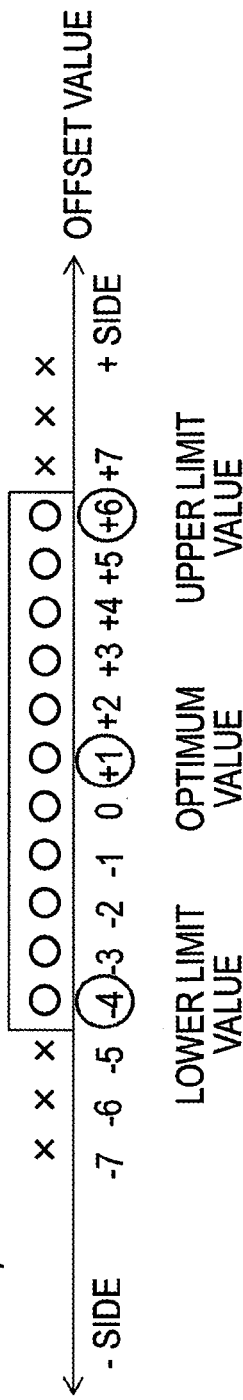
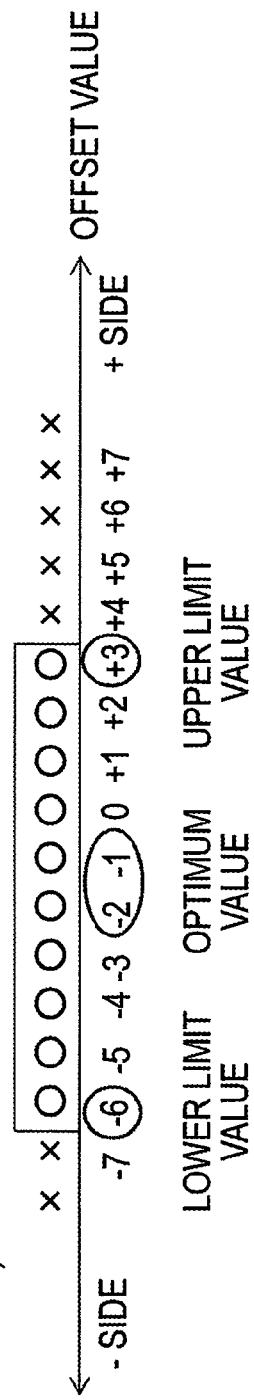

MEMORY CONTROLLER AND INFORMATION PROCESSING DEVICE

CROSS-REFERENCE TO RELATED APPLICATION

This application is based upon and claims the benefit of priority of the prior Japanese Patent Application No. 2014-011071, filed on Jan. 24, 2014, the entire contents of which are incorporated herein by reference.

FIELD

The present invention relates to a memory controller and an information processing device.

BACKGROUND

A memory controller is incorporated in an arithmetic processing device (CPU chip) and controls memory access to a main memory in response to a memory access request from an arithmetic processor (CPU core).

Alternatively, the memory controller is provided between the arithmetic processing device (CPU chip) and main memory and controls memory access from the arithmetic processing device.

A double data rate (DDR) synchronous dynamic random access memory (SDRAM) has been widely used as the main memory. The DDR SDRAM receives a clock from a memory controller and returns a data strobe signal (referred to hereinbelow as "DQS signal") generated on the basis of the clock and a data signal (referred to hereinbelow as "DQ signal") synchronized with the rising edge and falling edge of the DQS signal to the memory controller. The memory controller also latches (or fetches) the H level of L level of the DQ signal by using the timing of the rising edge and falling edge of the DQS signal.

For example, in the DDR SDRAM regulated by the DDR3 and later standards, a memory controller 20 causes a clock CLK to propagate to a plurality of memory chips in a main memory 30 in daisy-chain connection. As a result, the phases of the DQS signals returned from the memory chips are spread and do not match.

Accordingly, it has been suggested to provide a variable delay circuit that delays a DQS signal and a DQ signal in a signal receiving circuit in the memory controller, set a delay amount of a DQS signal variable delay circuit such that the phase of the received DQS signal matches the phase of the standard internal clock, also set the same set delay amount in the DQ signal variable delay circuit, and artificially synchronize the phase of the DQ signal with the phase of the internal clock.

SUMMARY

However, even when the delay amount of the variable delay circuit of the DQS signal is set such as to match the phase of the DQS signal with the phase of the internal clock and the same delay amount is set in the variable delay circuit of the DQ signal, the phase of the DQ signal sometimes does not match the phase of the internal clock because there is a certain spread in characteristics between the variable delay circuit of the DQS signal and the variable delay circuit of the DQ signal, the circuit configuration of the DQS signal differs from the circuit configuration of the DQ signal, and the circuits are disposed at different positions on the chip.

As a result, where the phase-tuned DQ signal is latched at the timing of the internal clock, the setup margin and hold margin of the latch circuit sometimes do not have maximum values. As a consequence, a data fetch error of the DQ signal may occur.

An aspect of the present embodiment is a memory controller comprising:

a first variable delay circuit that delays a data strobe signal received from a memory; and a second variable delay circuit that variably delays a data signal which is received from the memory and is synchronous with the data strobe signal, and that is set a second delay amount which is different from a first delay amount of the first variable delay circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 13 illustrates examples of the upper limit value, lower limit value, and optimum offset value.

DESCRIPTION OF EMBODIMENTS

Figure 1A:
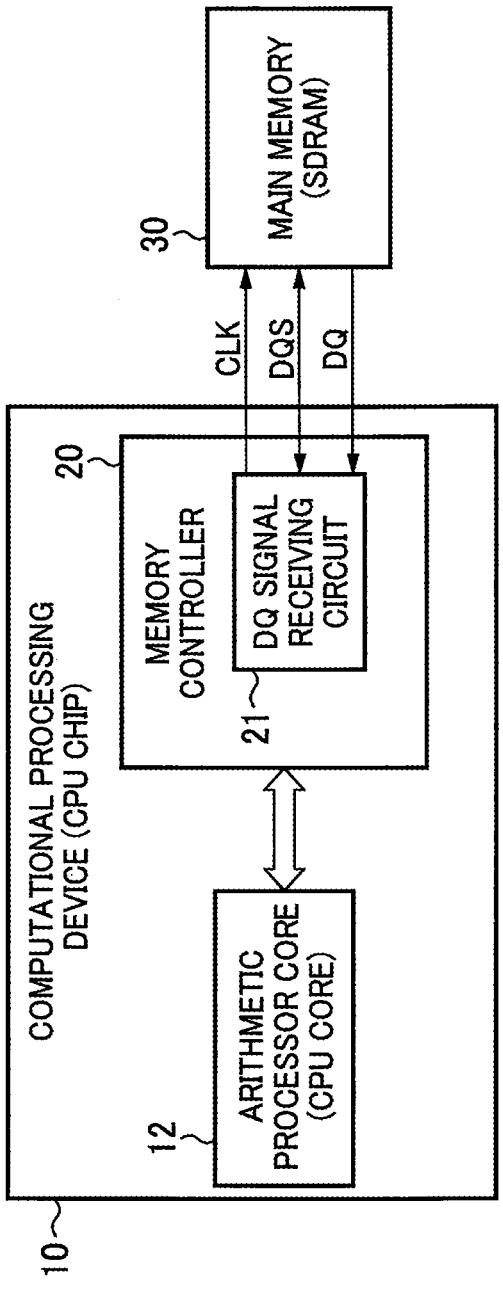
FIG. 1A and FIG. 1B depict configuration examples of an information processing device having a memory controller, an arithmetic processing device (CPU chip), and a main memory according to the present embodiment.
Figure 1B:
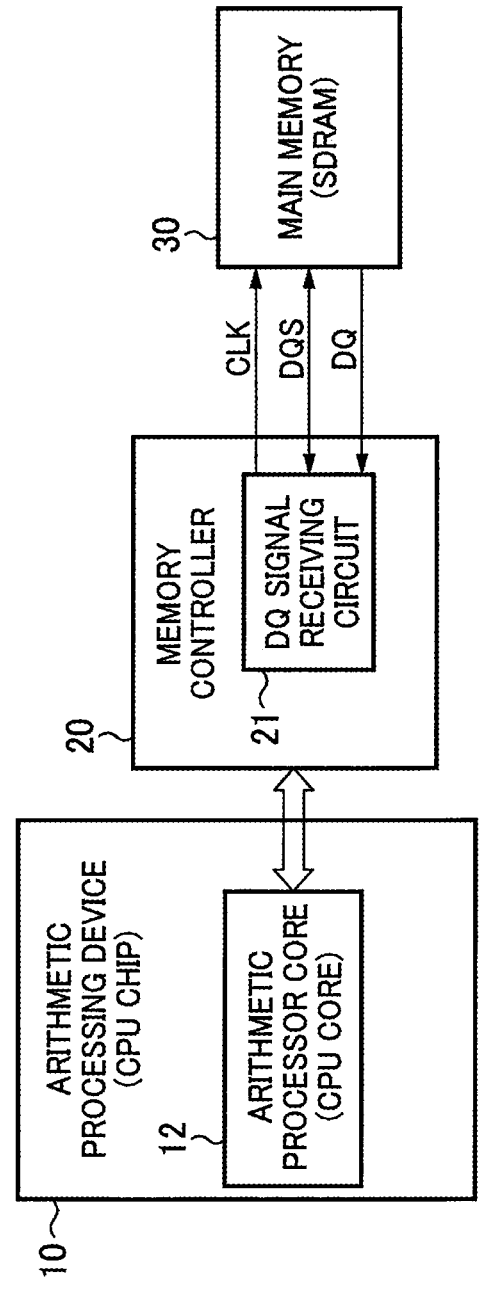

FIG. 1A and FIG. 1B depict configuration examples of an information processing device having a memory controller, an arithmetic processing device (CPU chip), and a main memory according to the present embodiment. FIG. 1A depicts an information processing device (computer system) having an arithmetic processing device (CPU chip) 10 having an arithmetic processor core (CPU core) 12 and a memory controller 20, and a main memory 30. The arithmetic processor (CPU core) 12 issues a memory access request to the memory controller 20, and the memory controller 20 transmits a command, an address, and a clock CLK (not illustrated in the figure) to the main memory 30 in response to the memory access request. Meanwhile, in the case of a read request, the main memory 30 returns to the memory controller 20 a data strobe signal DQS (referred to hereinbelow as "DQS signal") generated on the basis of the supplied clock CLK and a data signal DQ (referred to hereinbelow as "DQ signal") synchronized with a rising edge and falling edge of the DQS signal. The memory controller 20 has a DQ signal receiving circuit 21, and the DQ signal receiving circuit 21 fetches (latches) the DQ signal on the basis of the phase of the received DQS signal. The memory controller 20 then transmits the latched DQ signal to the arithmetic processor (CPU core) 12.

FIG. 1B depicts an information processing device having the arithmetic processing device (CPU chip) 10 incorporating the arithmetic processor core (CPU core) 12, the memory controller 20 configured by a chip different from the arithmetic processing device 10, and the main memory 30. The operation relating to the memory access of the arithmetic processor core (CPU core) 12, the memory controller 20, and the main memory 30 is the same as illustrated by FIG. 1A.

In a DDR SDRAM regulated by the DDR3 and later standards, the memory controller 20 causes a clock CLK to propagate to a plurality of memory chips in the main memory 30 in daisy-chain connection. As a result, the phases of the DQS signals returned from the memory chips are spread and do not match.

Accordingly, the DQ signal receiving circuit 21 of the memory controller 20 fetches (latches) the DQ signal on the basis of the phase of the DQS signal, variably tunes the phase of the latched DQ signal so as to minimize the difference between the phase of the DQS signal and the phase of the internal clock in the memory controller, and fetches (latches) the phase-tuned DQ signal on the basis of the phase of the internal clock. In other words, the DQ signal receiving circuit 21 changes the timing of the DQ signal from the timing of the DQS signal to the timing of the clock in the memory controller 20 or arithmetic processor core 12.

[Brief Description of DQ Signal Receiving Circuit]

Figure 2:
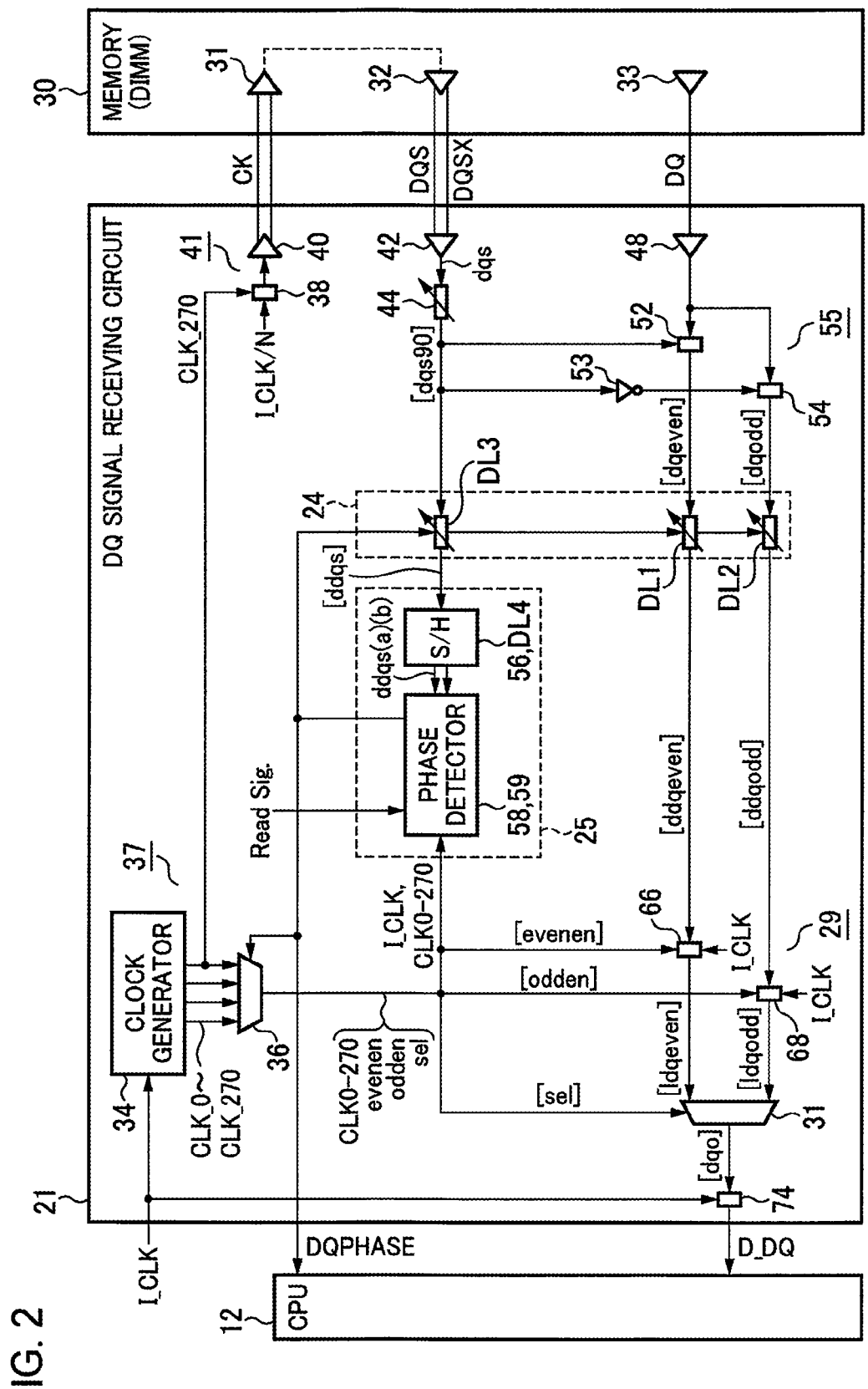
FIG. 2 illustrates an example of the configuration of the DQ signal receiving circuit.
Figure 3:
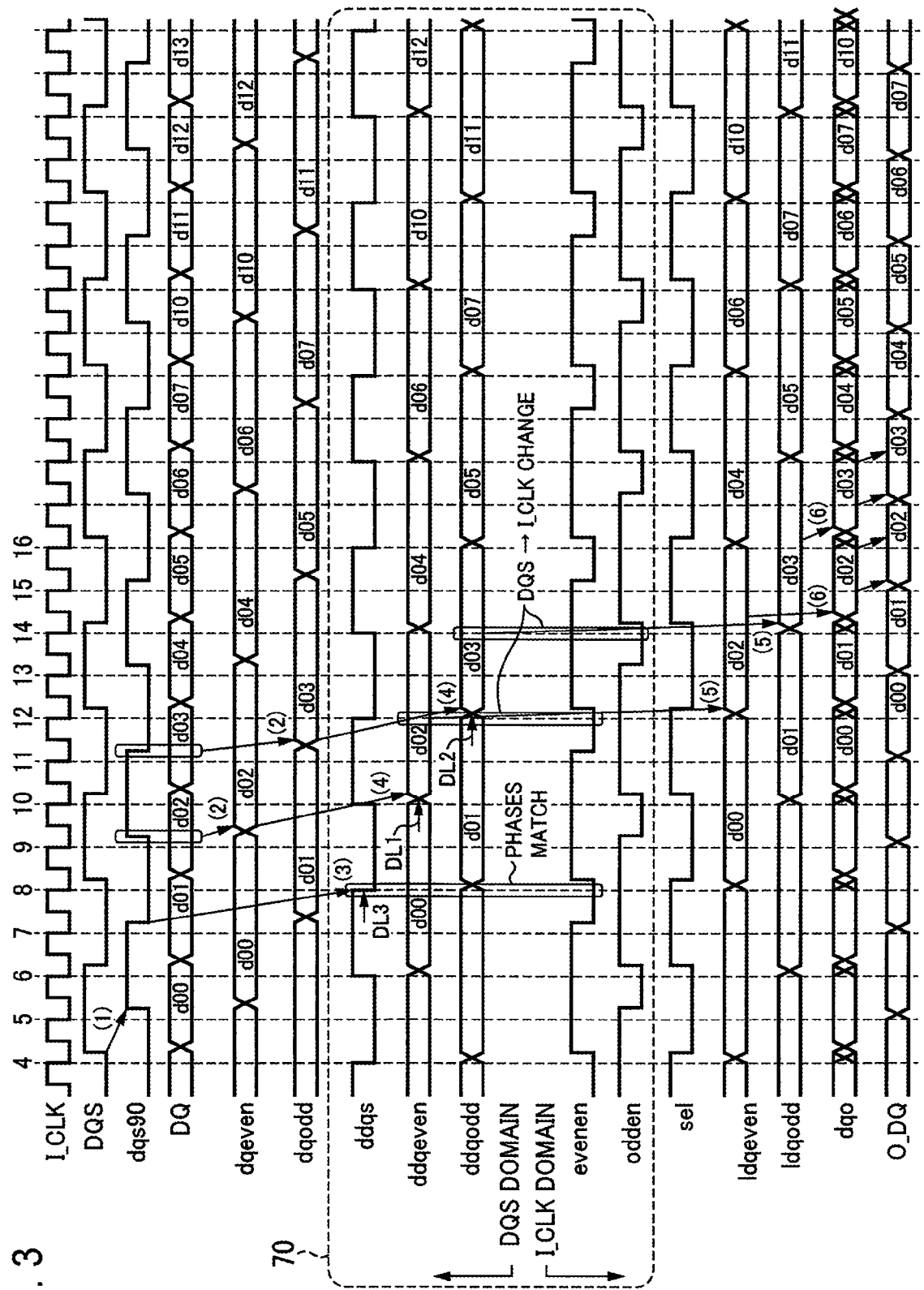
FIG. 3 is a timing chart illustrating the operation of the DQ signal receiving circuit.

FIG. 2 illustrates an example of the configuration of the DQ signal receiving circuit. FIG. 3 is a timing chart illustrating the operation of the DQ signal receiving circuit.

The DQ signal receiving circuit 21 has a clock generation unit 37 having a selector 36 and a clock generator 34 generating a phased clock CLK_0-270 having N (N is a positive integer) phases, for example four phases, from an internal clock I_CLK. The clock generation unit 37 is provided to select the optimum phased clock CLK_0-270 and to match the phases of the selected phased clock and the DQS signal when the phase spread of the DQS signals received from a plurality of memory chips exceeds one period of the internal clock I_CLK. The phased clock will be described below in greater detail.

Further, the DQ signal receiving circuit 21 has a clock output unit 41 including a circuit 38 that latches, in response to the phased clock CLK_270, a signal I_CLK/N obtained by dividing the inner clock I_CLK by N and an output buffer 40 that outputs the latched signal as a differential clock CK.

The DQ signal receiving circuit 21 also has a DQS input buffer 42 that inputs differential data strobe signals DQS, DQSx transmitted from the memory chips located inside the main memory 30, and a DQ input buffer 48 that inputs a single-phase data signal DQ transmitted from the same memory chip.

Each memory chip in the main memory 30 has an input buffer 31 that receives the clock CK, a DQS output buffer 32 that outputs the DQS signal on the basis of the received clock CK, and a DQ output buffer 33 that outputs the DQ signal synchronized with the rising edge and falling edge of the DQS signal. Each memory chip in the main memory 30 transmits the DQS signals DQS, DQSx and the DQ signal as a pair to the memory controller 20.

The DQS signal has a frequency which is 1/Nth, for example ¼th (four-fold period) of the internal clock I_CLK in the memory controller. However, the phase of the DQS signal received by the DQ signal receiving circuit 21 is asynchronous with the phase of the internal clock I_CLK, and the delay time of the transmission path between the memory 30 and the DQ signal receiving circuit 21 cannot be forecasted. Therefore, the phase difference therebetween also cannot be predicted.

Therefore, firstly, the DQ signal receiving circuit 21 in the memory controller 20 has a DQ signal fetch circuit 55 including DQ signal latch circuits 52, 54 that latch the H level or L level of the DQ signal on the basis of the phase of the rising edge and falling edge of the received DQS signal since the phases of the received DQS signal and DQ signal are synchronized.

Secondly, the DQ signal receiving circuit 21 has a phase detection unit 25 that detects the phase difference between the internal clock I_CLK and the DQS signal since the phase of the DQS signal and the phase of the internal clock I_CLK are asynchronous, a phase tuning unit 24 that tunes the phase of the DQ signal by applying a delay which reduces, preferably minimizes, the detected phase difference, and a change clock switch circuit 29 that latches the phase-tuned DQ signal with the internal clock I_CLK, so as to reduce, preferably minimize, the phase difference with the internal clock I_CLK, and thereby changing the timing of the DQ signal from the phase of the DQS signal to the phase of the internal clock I_CLK.

The input buffer 42 output an internal DQS signal dqs. And a 90° phase shift circuit 44 performs 90° phase shift of the internal DQS signal dqs. The DQ signal fetch circuit 55 has the DQ signal latch circuits 52, 54 that latch the DQ signal inputted by a DQ input buffer 48 at the timing of both edges of the 90° phase shift signal dqs90. The latch circuit 52 latches the DQ signal synchronously with the rising edge of the 90° phase shift signal dqs90, and the latch circuit 54 latches the DQ signal synchronously with the falling edge of the 90° phase shift signal dqs90.

The phase tuning unit 24 has a third variable delay circuit DL3 that delays the 90° phase-shifted DQS signal dqs90 and generates a delay DQS signal ddqs, and first and second variable delay circuits DL1, DL2 that delay DQ signals dqeven, dqodd latched by the latch circuits 52, 54 and generate delay DQ signals ddqeven, ddqodd. Those variable delay circuits DL1, DL2, and DL3 advance or delay the phase on the basis of a variable delay setting value DQPHASE generated by the below-described phase comparator 25.

The DQ signal receiving circuit 21 also has the phase comparator 25 that compares the phase of the DQS signal with the phase of the internal clock I_CLK and generates the variable delay setting value DQPHASE for phase tuning. The variable delay setting value DQPHASE indicates the delay amount such as to reduce, preferably minimize, the phase difference correspondingly to the phase difference between the DQS signal and the internal clock I_CLK. The variable delay setting value DQPHASE supplies the significant bit to a selector 36. As a result, the selector 36 selects a phased clock having the phase of the falling edge of the internal clock I_CLK which is the closest to the phase of the DQS signal from among the four phased clocks CLK_0-CLK_270. Further, the variable delay setting value DQPHASE supplies the lower bit to the first, second, and third variable delay circuits DL1, DL2, and DL3, whereby the DQS signal dqs90 and the DQ signals dqeven and dqodd are delayed by the delay time corresponding to the lower bit of the variable delay setting value DQPHASE.

[Clock Generation Unit 37]

The clock generation unit 37 is described prior to describing the phase comparator 25 in greater detail. The clock generation unit 37 has the clock generator 34 and the selector 36.

Figure 4:
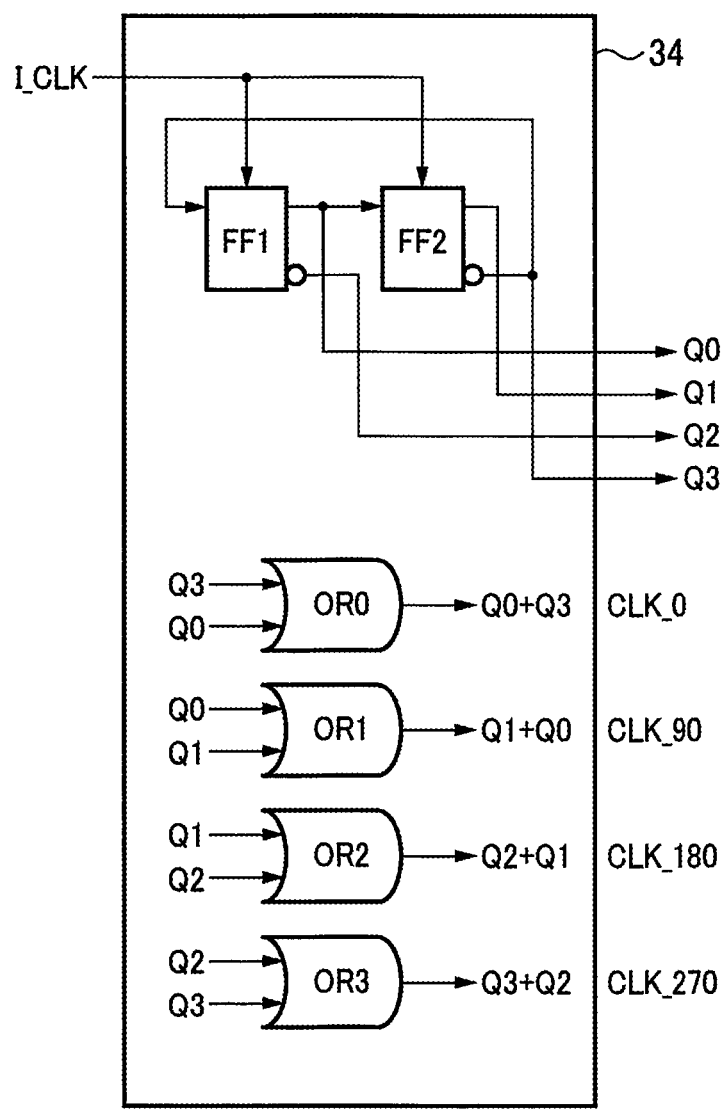
FIG. 4 depicts the circuitry of the clock generator 34.
Figure 5:
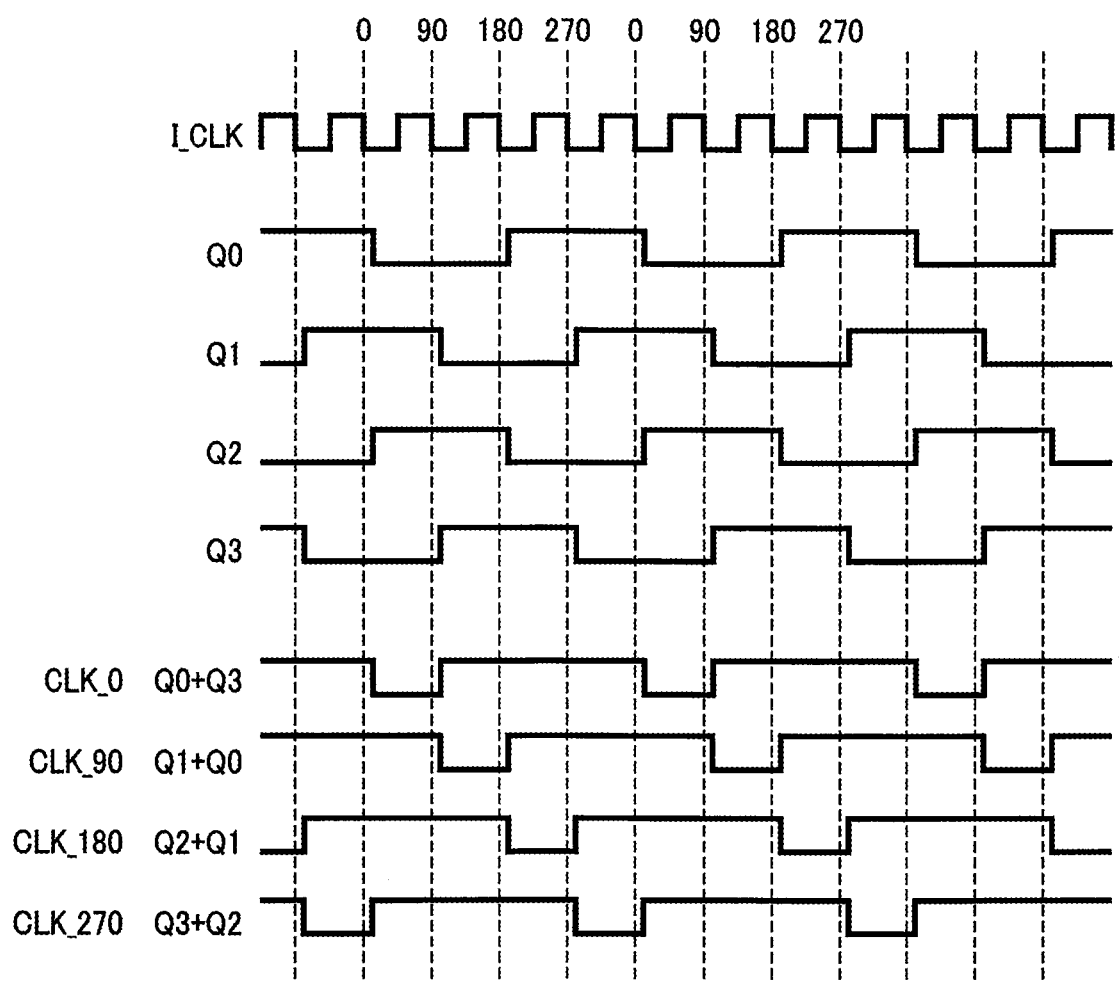
FIG. 5 depicts the signal waveform generated by the clock generator 34.

FIG. 4 depicts the circuitry of the clock generator 34. FIG. 5 depicts the signal waveform generated by the clock generator 34. The clock generator 34 has a ring oscillator operating in response to the internal clock I_CLK. The ring oscillator is configured by connecting two flip-flops FF1, FF2 in a ring fashion. The noninverting output of the flip-flop FF1 is connected to the input of the flip-flop FF2, and the inverting output of the flip-flop FF2 is connected to the input of the flip-flop FF1. The ring oscillator also generates four phase clocks Q0-Q3 obtained by dividing the internal clock I_CLK by four and having a four-fold period, as depicted in FIG. 5.

As depicted in FIG. 5, where the consecutive falling edges of the internal clock I_CLK are set at 0°, 90°, 180°, and 270°, the falling edges of the four phase clocks Q0, Q1, Q2, and Q3 match 0°, 90°, 180°, and 270°, respectively. The frequency and phase of the four phase clocks Q0, Q1, Q2, and Q3 are the same as those of the DQS signal.

Further, the clock generator 34 depicted in FIG. 4 has four OR gates OR0, OR1, OR2, and OR3, and the OR gates input a pair of four phase clocks Q3/Q0, Q0/Q1, Q1/Q2, and Q2/Q3, respectively, and output the phased clocks CLK_0, CLK_90, CLK_180, and CLK_270. In the phased clocks CLK_0, CLK_90, CLK_180, and CLK_270, the falling edges match the falling edges at 0°, 90°, 180°, and 270° of the internal clock I_CLK, respectively, and the phased clocks have an L level period corresponding to one period of the internal clock I_CLK and an H level period corresponding to three periods.

Where the internal clock I_CLK has a frequency which is N times (N is a positive integer) that of the DQS signal, the clock generator 34 generates N phased clocks from an N(=$2^n$)-divided clock. In this case, the clock generator 34 generates N-phase clocks with the ring oscillator in which n flip-flops are connected, and combines the N-phase clocks to generate N timing clocks having N phases corresponding to the DQS signal with one level in a phase period from (360/N)×M to (360/N)×(M+1). M is an integer from 0 to (N−1). For example, when N=4, 360/N=90, M=0-3. Therefore, N timing clocks are L level of H level in 0-90 degree, 90-180 degree, 180-270 degree and 270-360 degree.

[Phase Comparator]

Figure 6:
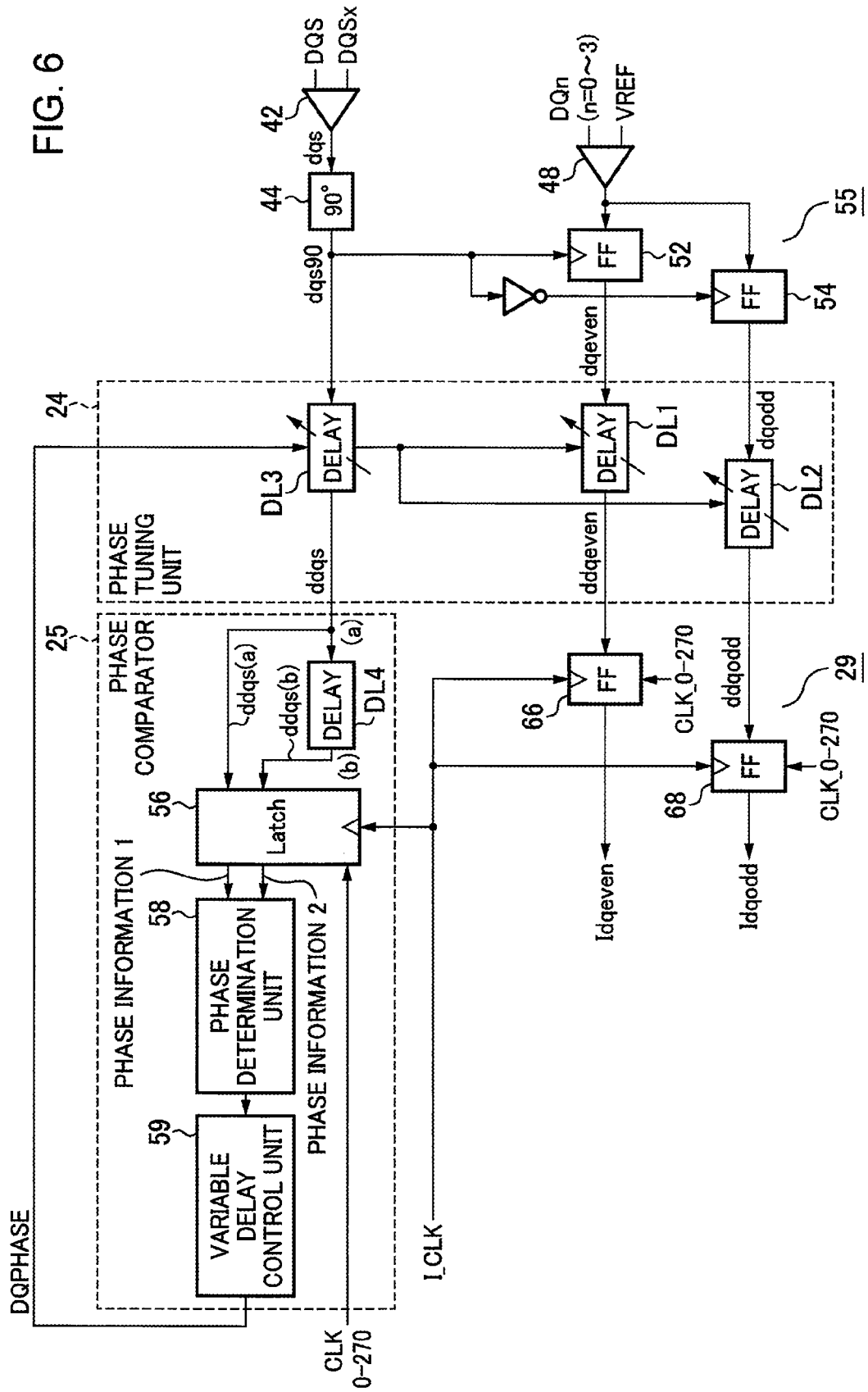
FIG. 6 depicts the detailed circuitry for the phase comparator 25.

FIG. 6 depicts the detailed circuitry for the phase comparator 25. As mentioned hereinabove, the phase comparator 25 compares the phases of the DQS signal and the internal clock I_CLK and generates the variable delay setting value DQPHASE such as to reduce, preferably minimize, the phase difference. However, since the DQS signal has a period which is four times that of the internal clock I_CLK, the clock generator 34 generates four phased clocks CLK_0, CLK_90, CLK_180, and CLK_270 and the selector 36 selects a certain phased clock in order to perform phase comparison between the falling edge of the DQS signal and the falling edge of the internal clock I_CLK, the timing of which is the closest to the DQ signal. The falling edge of the selected phased clock CLK0-270 is supplied as an enable clock to the phase comparator 25. The phase comparator 25 then performs phase comparison between the falling edge of the internal clock I_CLK in a period in which the enable clock CLK0-270 is at the L level and the falling edge of the DQS signal.

The phase comparator 25 has a delay circuit DL4 that delays the delay DQS signal ddqs by a very small fixed width, and a latch circuit 56 that synchronizes and latches the input ddqs(a) and output ddqs(b) of the delay circuit DL4 with the falling edge of the internal clock I_CLK in the L-level period of the phased clocks CLK-0-270. In other words, the latch circuit 56 is enabled by the L level of the phased clocks CLK-0-270.

The phase comparator 25 also has a phase determination unit 58 that determines the phase difference between the falling edge of the delay DQS signal ddqs and the falling edge of the internal clock I_CLK on the basis of phase information 1 and 2 which is data on ddqs(a) and ddqs(b) latched by the latch circuit 56. The phase comparator 25 also has a variable delay control unit 59 that generates the variable delay setting value DQPHASE such as to reduce the phase difference on the basis of the phase determination result of the phase determination unit 58.

Figure 7:
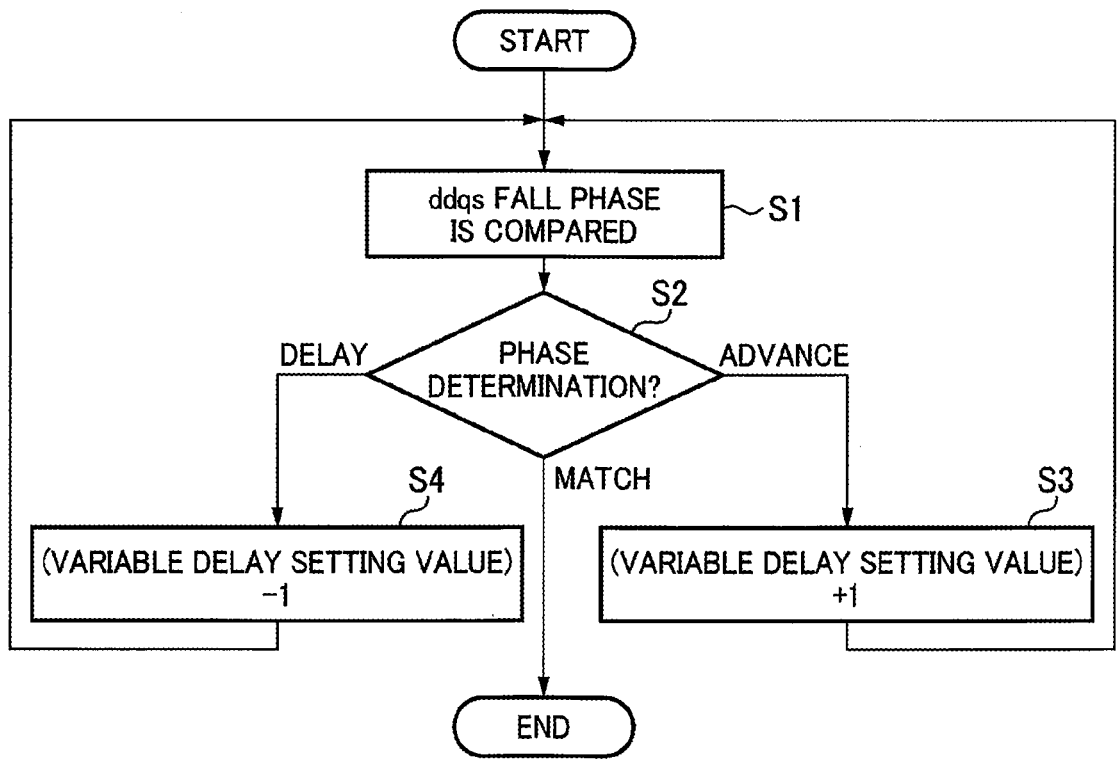
FIG. 7 is a flowchart illustrating the operation performed by the phase comparator 25 and the phase tuning unit 24.
Figure 8:
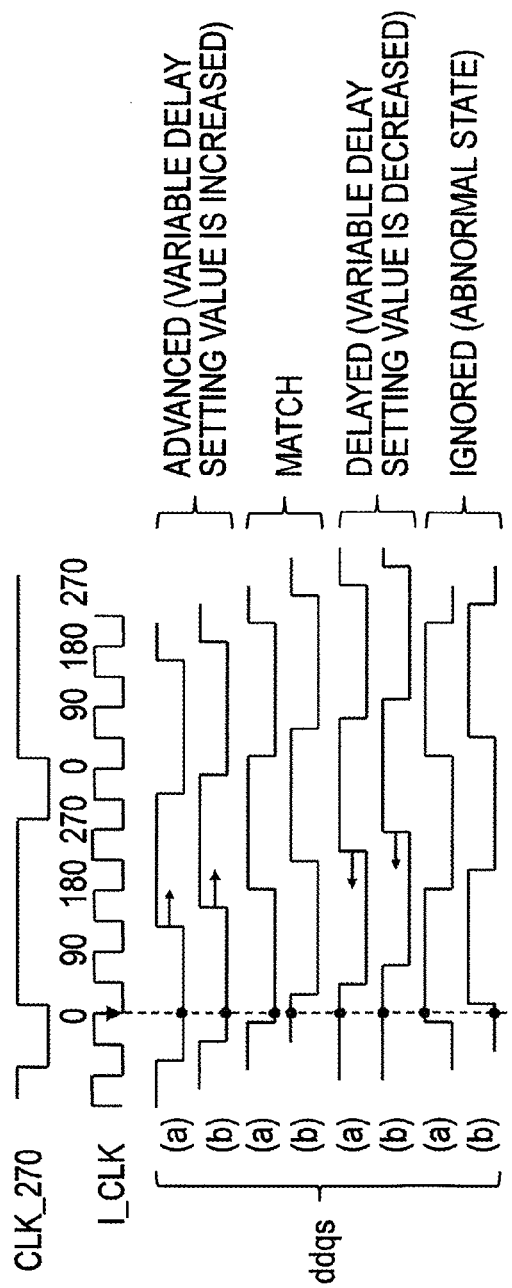
FIG. 8 illustrates the operation of the phase determination unit 58 in the phase comparator 25.

The operation of the phase comparator 25 is described hereinafter. FIG. 7 is a flowchart illustrating the operation performed by the phase comparator 25 and the phase tuning unit 24. FIG. 8 illustrates the operation of the phase determination unit 58 in the phase comparator 25.

As depicted in the flowchart in FIG. 7, the phase determination unit 58 of the phase comparator 25 performs phase comparison of the falling edge of the delay DQS signal ddqs and the falling edge of the internal clock I_CLK in the L-level period of the phased clocks CLK_0-270 (S1). Where the phase determination result is "ADVANCE" ("ADVANCE" in S2), the variable delay control unit 59 adds 1 to the variable delay setting value DQPHASE of the variable delay circuit DL3 so as to increase the delay amount of the variable delay circuit DL3 (S3). Where the phase determination result is "DELAY" ("DELAY" in S2), the variable delay control unit 59 subtracts 1 from the variable delay setting value DQPHASE of the variable delay circuit DL3 so as to decrease the delay amount of the variable delay circuit DL3 (S4).

Then, the phase determination unit 58 repeats the above-described phase comparison S1, phase determination S2, and tuning S3 and S4 of the variable delay setting value until the phases match in the phase determination S2 (the phase difference is equal to zero or a minimum value). Where it is detected in the phase determination S2 that the phases have matched (or the phase difference has reached a minimum value), the phase tuning operation by the phase comparator 25 and the phase tuning unit 24 is ended. The variable delay setting value DQPHASE is also supplied to the first and second variable delay circuits DL1, DL2, so that the phase of the delay DQ signals ddqeven and ddqodd, which are the output thereof, matches the phase of the falling edge of the internal clock I_CLK or is the closest thereto.

Returning to FIG. 6, the variable delay circuit DL3 delays the 90° phase shift DQS signal dqs90 by the variable delay setting value DQPHASE, and outputs the delay DQS signal ddqs(a). The variable delay circuit DL4 then further delays the delay DQS signal ddqs(a) by a very small fixed delay and outputs yet another delay DQS signal ddqs(b).

As indicated in FIG. 8 illustrating the operation of the phase determination unit 58 of the phase comparator 25, the latch circuit 56 latches the two delay DQS signals ddqs(a) and ddqs(b) synchronously with the falling edge of the internal clock I_CLK in the L-level period of the phased clock CLK_270. In the example depicted in FIG. 8, the delay DQS signals ddqs(a) and ddqs(b) are latched at the falling edge of the internal clock I_CLK in the L-level period of the phased clock CLK_270. Then, the phase determination unit 58 detects whether the phase of the falling edges of the delay DQS signals ddqs(a) and ddqs(b) is advanced or delayed to, or matched with (or the closest to) the falling edge of the internal clock I_CLK on the basis of the phase information 2 and 1 latched by the latch circuit 56.

As indicated in the phase comparison truth table in FIG. 8, when the phase information 2 and 1 latched by the latch circuit 56 is "00", the phase of the falling edge of the delay DQS signals ddqs(a) and ddqs(b) is advanced to that of the falling edge of the internal clock I_CLK. Where the information is "10", the phases match, and where the information is "11", the former phase is delayed to the latter. Where the information is "01", an abnormal state is assumed and this case is ignored.

[Operation of DQ Signal Receiving Circuit]

The operation of the DQ signal receiving circuit depicted in FIG. 2 will be explained hereinbelow with reference to the timing chart depicted in FIG. 3. The timing chart depicted in FIG. 3 illustrates the operation in a state in which the phase has already been tuned such that the phases of the DQS signal ddqs(a) and the internal clock I_CLK match or are the closest to each other.

The DQ signal receiving circuit 21 generates the 90° phase shift signal dqs90 by shifting the received DQ signal dqs by a phase of 90° with the 90° phase shift circuit 44. This is indicated by an arrow (1) in FIG. 3. The DQ signal latch circuit 52 then latches the even-numbered data dqeven of the DQ signal synchronously with the rising edge of the 90° phase shift signal dqs90, and the DQ signal latch circuit 54 then latches the odd-numbered data dqodd of the DQ signal synchronously with the falling edge of the 90° phase shift signal dqs90. This is indicated by an arrow (2) in FIG. 3.

Then, the third variable delay circuit DL3 of the phase tuning unit 24 delays the 90° phase shift signal dqs90 by the delay amount corresponding to the variable delay setting value DQPHASE and generates the delay DQS signal ddqs. This is indicated by an arrow (3) in FIG. 3.

The latch circuit 56 of the phase comparator 25 latches the delay DQS signals ddqs(a) and ddqs(b) at the falling edge (falling edge No. 8 in FIG. 3) of the internal clock I_CLK in the period in which the even enable signal evenen corresponding to the phase clock CLK_270 is at the L level.

The phase determination unit 58 and the variable delay control unit 59 then generate the phase delay setting value DQPHASE such that the phase of the falling edge of the delay DQS signal ddqs(a) approaches, matches, or becomes the closest to the phase of the falling edge No. 8 of the internal clock I_CLK (the phase difference decreases, or becomes zero, or reaches a minimum).

Where the phases match or become the closest to each other, in FIG. 3, the phase falling edge of the delay DQS signal ddqs delayed by the delay amount DL3 by the third variable delay circuit DL3 matches or becomes the closest to the phase of the falling edge No. 8 of the internal clock I_CLK.

The first and second variable delay circuits DL1 and DL2 delay the latched DQ signals dqeven and dqodd by the delay amounts DL1 and DL2 corresponding to the variable delay setting value DQPHASE to reach the falling edges No. 10 and No. 12 of the internal clock I_CLK, and output the delay DQ signals ddqeven and ddqodd. This is indicated by an arrow (4) in FIG. 3.

Then, a latch circuit 66 of the clock switch circuit 29 latches the delay DQ signal ddqeven of data d02 at the falling edge No. 12 of the internal I_CLK in the period in which the even enable signal evenen corresponding to the phase clock CLK_270 is at the L level, and outputs an internal synchro DQ signal Idqeven(d02). Likewise, a latch circuit 68 latches the delay DQ signal ddqodd of data d03 at the falling edge No. 14 of the internal I_CLK in the period in which the odd enable signal odden corresponding to the phase clock CLK_90 is at the L level, and outputs an internal synchro DQ signal Idqodd(d03). This is indicated by arrow (5) in FIG. 3. As a result, the changing the timing of the DQ signal from the timing of the DQS signal to the timing of the internal clock I_CLK is completed.

Then, the selector 31 selects the internal synchro DQ signal Idqeven(d02) at a timing (falling edge No. 14 of the internal clock I_CLK) at which a select signal SEL corresponding to the quartered clock Q0 depicted in FIG. 5 rises, and selects the internal synchro DQ signal Idqodd(d03) at a timing (falling edge No. 16 of the internal clock I_CLK) at which the select signal SEL falls. This is indicated by an arrow (6) in FIG. 3. A DQ output signal dqo which is the output of the selector 31 is thus converted to a two-fold frequency.

Then, the latch circuit 74 latches the DQ output signal dqo selected by the selector 31 at the falling edge of the internal clock I_CLK and outputs the latched signal D_DQ as the DQ signal to the CPU 12. The DQ output signal dqo is a data signal synchronous with the falling edge of the internal clock I_CLK and has a period same as that of a data signal changing every ½ period of the DQS signal similarly to the DQ signal received from the main memory 30.

The meaning of the clock generator 34 generating the phased clocks CLK_0, CLK_90, CLK_180, and CLK_270 is explained hereinbelow. In the DQ signal receiving circuit 21 depicted in FIG. 2, the variable delay circuit DL3 in the phase tuning unit 24 is a fine tuning circuit for matching the phase of the DQS signal with the phase of the internal clock I_CLK or bringing the two phases most closely to each other. Meanwhile, the circuit of the clock generator 34 and the selector 36 is a rough tuning circuit for matching the phase of the DQS signal with the phase of the internal clock I_CLK.

Thus, the variable delay circuits DL1, DL2, and DL3 in the phase tuning unit 24 hold only the delay amount that is necessary for tuning the phase of the DQS signal within a 90° range, which is the delay amount corresponding to the lower bit of the variable delay setting value DQPHASE. As a result, the scale of the variable delay circuit can be reduced. Meanwhile, two significant bits of the variable delay setting value DQPHASE are supplied to the selector 36, and when the variable delay setting value DQPHASE changes in response to a change in excess of the fine tuning range, the two significant bits change to switch the selector 36, thereby switching the phased clock CLK0-270 to a clock that differs in phase by +90° or −90°. In this case, the lower bit in the variable delay setting value DQPHASE, which is supplied to the variable delay circuit DL3, is reset.

Thus, since the falling edge of the internal clock I_CLK can be selected by selecting, as appropriate, the four phased clocks CLK_0-270, phase tuning can be performed by using the same variable delay circuits DL1, DL2, and DL3 such that the falling edge of the DQS signal matches or becomes the closest to the falling edge of the internal clock I_CLK even when the phase shift of the DQS signal exceeds one period of the internal clock I_CLK (or the range of DL3 in which the delay can be tuned).

[DQ Signal Receiving Circuit of the Present Embodiment]

Figure 9:
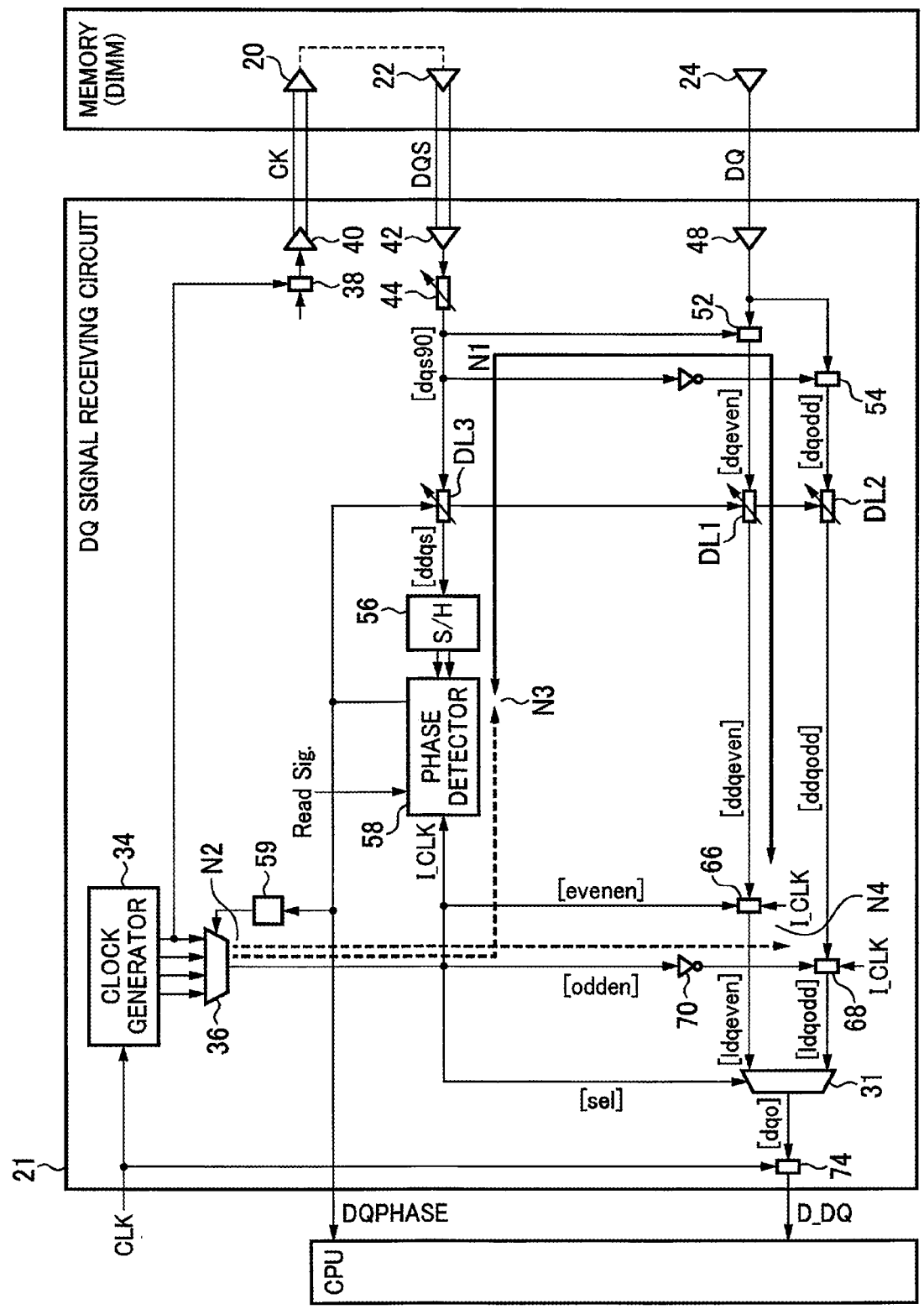
FIG. 9 illustrates problems associated with the DQ signal receiving circuit depicted in FIG. 2.

FIG. 9 illustrates problems associated with the DQ signal receiving circuit depicted in FIG. 2. FIG. 9 depicts the DQ signal receiving circuit 21 same as that depicted in FIG. 2. The DQ signal receiving circuit 21 delays the DQS signal dqs90, which is obtained by a 90° phase shift of the received DQS signal, with the third variable delay circuit DL3 and performs control such as to match the phase of the falling edge of the delay DQS signal ddqs with the phase of the falling edge of the internal clock I_CLK or to bring the two phases most closely to each other. Therefore, the control is performed such that the DQS signal dqs90 that has been shifted in phase by 90° and is generated in a node N1 is caused to propagate to a node N3, the internal clock I_CLK generated in node N2 is caused to propagate to a node N3, and the phase of the propagated delay DQS signal ddqs and the phase of the propagated internal clock I_CLK are matched or brought most closely to each other in the node N3.

Meanwhile, with respect to the DQ signal, the latch circuits 66 and 68 latch the delay DQ signals ddqeven and ddqodd in a node N4 in response to the falling edge of the internal clock I_CLK. Therefore, the latch timing of the delay DQ signals ddqeven and ddqodd is affected by the signal propagation time from the node N1 to the node N4 on the DQ signal side and also by the signal propagation time from the node N2 to the node N4 on the clock side. Further, the signal propagation time from the node N1 to the node N3 and the signal propagation time from the node N2 to the node N3 are microscopically not the same as the signal propagation time from the node N1 to the node N4 and the signal propagation time from the node N2 to the node N4.

Further, since the third variable delay circuit DL3 and the first and second variable delay circuits DL1 and DL2 are disposed at different positions on the chip, with different orientations, and sometimes at comparatively distant positions, they are affected differently by the surrounding circuits and have mutually different delay characteristics even when the circuits are the same.

The timing relationship at the node N4 is also different from the timing relationship at the node N3 because the front-stage circuit configurations and rear-stage circuit configurations of the third variable delay circuit DL3 and the first and second variable delay circuits DL1 and DL2 differ from each other.

As a result, even when the DQ signal is delayed by the delay setting value DQPHASE that matches the phase of the DQS signal with the phase of the internal clock I_CLK or brings the two phases most closely to each other, the latch circuits 66 and 68 do not necessarily receive the falling edge of the internal clock I_CLK at a timing at which the setup margin and hold margin of the delay DQ signals ddqeven and ddqodd are maximized. Where the reception timing of the falling edge of the internal clock I_CLK is shifted from the central timing of the delay DQ signals ddqeven and ddqodd, either one of the setup margin and hold margin in the latch circuits 66 and 68 decreases and the risk of latching the erroneous data rises. In particular, in the case of a DDR SDRAM, the frequency of the DQS signal further increases and the risk of latching the erroneous data rises.

Figure 10:
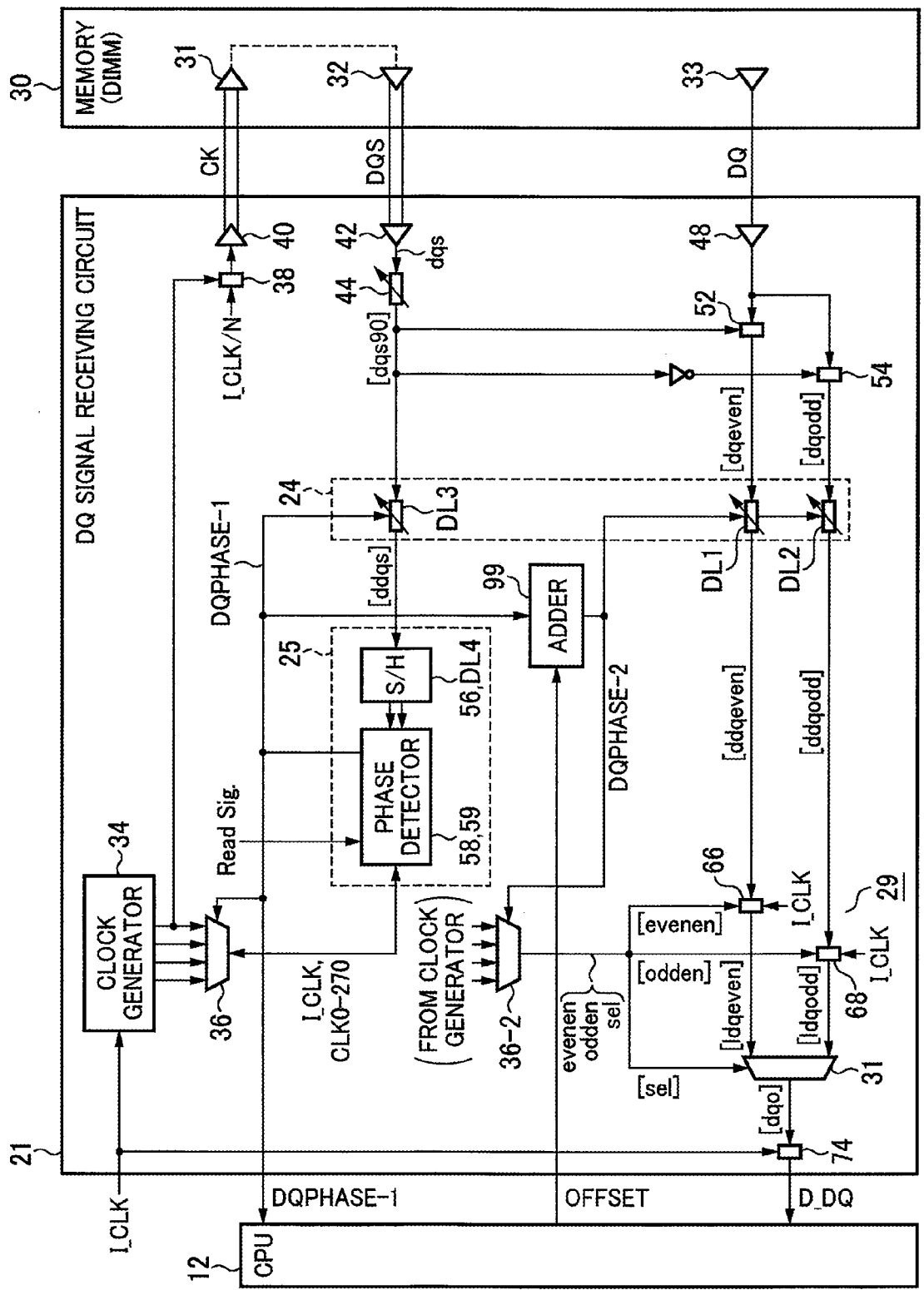
FIG. 10 illustrates the DQ signal receiving circuit in the present embodiment.

FIG. 10 illustrates the DQ signal receiving circuit in the present embodiment. The DQ signal receiving circuit 21 depicted in FIG. 10 differs from the DQ signal receiving circuit depicted in FIG. 2 in having an offset adder 99 that adds an offset OFFSET to a first variable delay setting value DQPHASE-1, which sets the delay amount of the variable delay circuit DL3 that delays the DQS signal, thereby generating a second variable delay setting value DQPHASE-2 with respect to the variable delay circuits DL1 and DL2 that delay the DQ signal. Furthermore, the DQ signal receiving circuit 21 has a second selector 36-2 that selects the control signals eveneen, odden, sel for latching the DQ signal on the basis of two significant bits of the second variable delay setting value DQPHASE-2 obtained by adding the offset.

The CPU 12 detects, in a training period, the optimum offset value in a state in which the phase comparator 25 detects the first variable delay setting value DQPHASE-1 at which the phase difference is zeroed or minimized. That is, the CPU 12 reads the known data from the main memory 30 while changing the offset value OFFSET that is to be set in the offset adder 99 in the (+) direction and (−) direction, and determines whether or not the DQ signal that has been read matches an expected value, thereby finding the lower limit offset value and upper limit offset value in which the read DQ signal matches the expected value. The CPU 12 then calculates the optimum offset value from the determined lower limit offset value and upper limit offset value, and sets the optimum offset value in the offset adder 99. The optimum offset value is, for example, the central value of lower limit offset value and upper limit offset value.

As a result, the phase shift of the DQS signal and DQ signal is corrected, the setup margin and hold margin in the latch circuits 66 and 68 are maximized, and the data read error is suppressed. Furthermore, since the CPU 12 detects the optimum offset value while reading the known data, no special circuit is required for detecting the optimum offset value in the DQ signal receiving circuit 21.

Similarly to the circuit depicted in FIG. 2, the DQ signal receiving circuit 21 depicted in FIG. 10 includes a 90° phase shift circuit 44 that shifts the phase of the received DQS signal dqs by 90°, the latch circuits 52 and 54 that latch the received DQ signal at the rising edge and falling edge of the 90° phase shift signal dqs90, the phase tuning unit 24 having the third variable delay circuit DL3 that delays the 90° phase shift signal dqs90 by the delay amount corresponding to the lower bit of the first variable delay setting value DQPHASE-1, the phase comparator 25 that detects the phase difference between the falling edge of the delay DQ signal ddqs and the falling edge of the internal clock I_CLK and generates the first variable delay setting value DQPHASE-1 such as to reduce the detected phase difference, and the latch circuit 74 for latching the signal dqo at the falling edge of the internal clock I_CLK, the operation of those component being the same as depicted in FIGS. 2 to 8. Accordingly, the explanation of the phase comparison and phase tuning operations performed thereby is herein omitted.

By contrast with the circuit depicted in FIG. 2, in the DQ signal receiving circuit 21 depicted in FIG. 10, the second and third variable delay circuits DL2 and DL3 delay the latched DQ signals dqeven and dqodd by the delay amount based of the lower bit of the second variable delay setting value DQPHASE-2, and there are provided the latch circuits 66 and 68 that latch the delay DQ signals ddqeven and ddqodd in response to the falling edge of the internal clock I_CLK within the L-level period of the enable signals eveneen and odden selected by the second selector 36-2 on the basis of the significant bit of the second variable delay setting value DQPHASE-2, and the selector 31 that selects the DQ signals Idqeven and Idqodd latched by the internal clock I_CLK on the basis of the similarly selected selection signal sel. The significant bit of the second variable delay setting value DQPHASE-2 can be different from the significant bit of the first variable delay setting value DQPHASE-1 due to the addition of the offset value OFFSET by the adder 99. Those operations will be described below.

Figure 11:
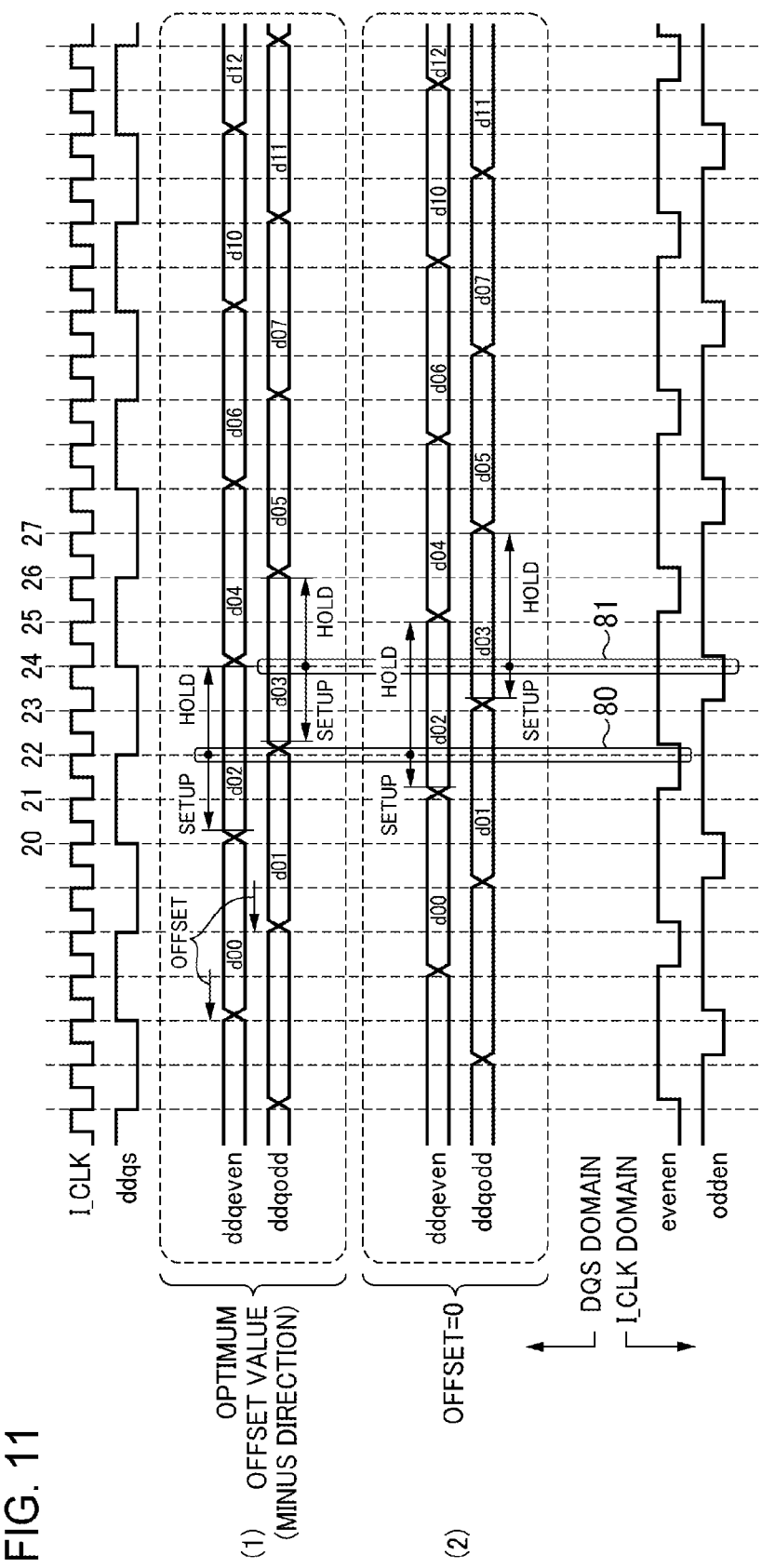
FIG. 11 depicts a setting example of the offset value in the present embodiment.

FIG. 11 depicts a setting example of the offset value in the present embodiment. FIG. 11 depicts the delay DQ signal ddqs, delay DQS signals ddqeven and ddqodd, and the enable signals evenen and odden indicated in a broken-line portion 70 in FIG. 3. FIG. 11 also depicts the delay DQS signals ddqeven and ddqodd in the case (2) in which the offset value OFFSET is zero and the case (1) in which the offset value OFFSET is non-zero (negative value).

Thus, in the circuit depicted in FIG. 11, phase tuning is performed such that the phases are matched or brought most closely to each other at the falling edge No. 22 of the internal clock I_CLK and the falling edge of the delay DQS signal ddqs. Further, as indicated in (2) in the figure, the setup amount for the falling edge No. 22 of the internal clock I_CLK, which relates to the delay DQ signals ddqeven and ddqodd that have been variably delayed by the second variable delay setting value DQPHASE-2 obtained by adding the offset value OFFSET=0 to the first variable delay setting value DQPHASE, is narrower than the hold amount. Therefore, the risk of the DQ signal fetch operation being performed erroneously rises.

Further, the time obtained by removing the setup time, which is necessary according to the standard, from the setup amount is the setup margin, and the time obtained by removing the hold time, which is necessary according to the standard, from the hold amount is the hold margin.

Meanwhile, in a state in which the phase tuning has been performed such that the phase of the falling edge of the DQS signals matches the phase of the falling edge of the internal clock I_CLK, or two phases are brought most closely to each other, and the first variable delay setting value DQPHASE-1 has been established, as indicated in (1) in the figure, the offset value OFFSET is changed to the negative side. According to this change of OFFSET, the setup amount and hold amount for the falling edge No. 22 of the internal clock I_CLK for the delay DQ signals ddqeven and ddqodd, which have been variably delayed by the second variable delay setting value DQPHASE-2, are same, and the setup margin and hold margin are maximized. In other words, in FIG. 11, when (1) the offset value OFFSET is non-zero, the delay DQ signals ddqeven and ddqodd, which have been variably delayed by the second variable delay setting value DQPHASE-2, hold the data d02 and d03 from the falling edges No. 20 and 22 to the falling edges No. 24 and 26, respectively, of the internal clock I_CLK, and the falling edges No. 22 and 24 of the internal clock I_CLK, which are the timings at which the latch circuits 66 and 68 latch, are in substantially central positions of those data holding periods.

Where the setup amount is larger than the hold amount, unlike in the example (2) in FIG. 11 in which there is no OFFSET, the setup amount and hold amount is similarly equalized and maximized by selecting a positive offset value OFFSET.

Figure 12:
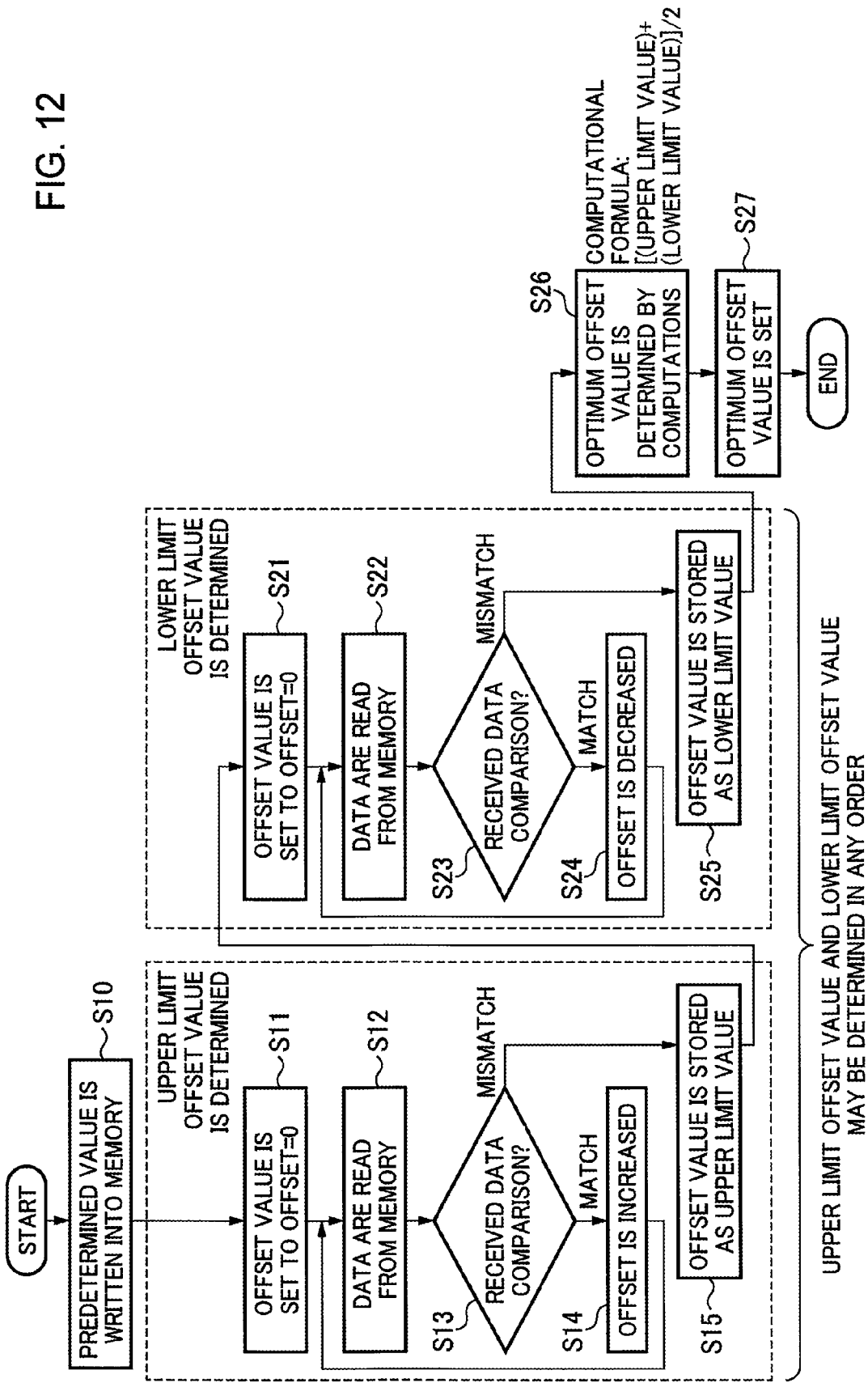
FIG. 12 is a flowchart of an offset value setting step performed by the CPU in the present embodiment.

FIG. 12 is a flowchart of an offset value setting step performed by the CPU in the present embodiment. The CPU 12 executes an offset value setting program expanded in the memory 30 and executes the offset value setting step illustrated by FIG. 12. The offset value setting step performed by the CPU is executed, for example, when a power supply is switched on. Alternatively, this step may be executed at a timing at which operation environment, for example, a temperature, changes.

As preliminary processing, the CPU 12 repeats a read request to the memory 30, and the DQ signal receiving circuit 21 performs the phase tuning of the DQS signal and establishes the first variable delay setting value DQPHASE-1 such that the phase of the DQS signal supplied from the memory 30 matches the phase of the internal clock I_CLK, or the two phases are brought most closely to each other.

After the first variable delay setting value DQPHASE-1 has thus been established in advance such that the phases of the DQS signal and the internal clock I_CLK are matched or brought most closely to each other, the CPU 12 writes predetermined data into a prescribed address of the memory 30 (S10). Then, steps S11 to S15 for determining an upper limit offset value and steps S21 to S25 for determining a lower limit offset value are executed. The steps of either group may be performed before the steps of the other group.

In steps S11 to S15 for determining the upper limit offset value, the CPU 12 sets the offset value to OFFSET=0 (S11) and reads the known data that have been heretofore written into the memory 30 (S12). Then, in the DQ signal receiving circuit 21, the second and third variable delay circuits DL1 and DL2 delay the DQ signal, which has been read, by the delay amount of the lower bit of the second variable delay setting value DQPHASE-2 at the time OFFSET=0, and the latch circuits 66 and 68 latch the delay DQ signals ddqeven and ddqodd at the falling edge of the internal clock I_CLK in the L period of the enable signals evenen and odden, which have been selected by the significant bit of the second variable delay setting value DQPHASE-2, and transmit the latched signals to the CPU 12.

The CPU 12 compares the received data with the known data (S13), and where the data match, increases the offset value OFFSET (S14). Then, the CPU 12 reads the known data from the memory 30 again (S12) and compares the received data with the known data (S13) at the second variable delay setting value DQPHASE-2 determined by the offset value that has been newly set. Thus, the CPU 12 repeats the steps S12 to S14 until the received data mismatch the known data. The offset value OFFSET attained before the received data mismatch the known data is stored as the upper limit offset value (S15).

Then, in the steps S21 to S25 for determining the lower limit offset value, the CPU 12 sets the offset value to OFFSET=0 (S21) and reads the known data that have been heretofore written into the memory 30 (S22). Then, in the DQ signal receiving circuit 21, the second and third variable delay circuits DL1 and DL2 delay the DQ signal, which has been read, by the delay amount of the lower bit of the second variable delay setting value DQPHASE-2 at the time OFFSET=0, and the latch circuits 66 and 68 latch the delay DQ signals at the falling edge of the inner clock I_CLK in the L period of the enable signals evenen and odden, which have been selected by the significant bit of the second variable delay setting value DQPHASE-2, and transmit the latched signals to the CPU 12.

The CPU 12 compares the received data with the known data (S23), and where the data match, decreases the offset value OFFSET (S24). In other words, the offset value OFFSET is increased to the negative side. Then, the CPU 12 reads the known data from the memory 30 again (S22) and compares the received data with the known data (S23) at the second variable delay setting value DQPHASE-2 determined by the offset value that has been newly set. Thus, the CPU 12 repeats the steps S22 to S24 until the received data mismatch the known data. The offset value OFFSET before the received data mismatch the known data is stored as the lower limit offset value (S25).

Finally, the CPU 12, for example, computationally determines the central value of the upper limit and lower limit offset values as the optimum offset value (S26) and sets the optimum offset value in a register in the offset adder 99 (S27).

FIG. 13 illustrates examples of the upper limit value, lower limit value, and optimum offset value. In FIG. 13, with respect to the offset values plotted against the abscissa, the match of the data, which have been read, with the known expected values is denoted by (○) and the mismatch is denoted by (X). In example 1, the lower limit offset value is −4, the upper limit offset value is +6, and the optimum offset value is (−4+6)/2=+1. In example 2, the lower limit offset value is −6, the upper limit offset value is +3, and the optimum offset value is (−6+3)/2=−1 or −2. Which value to take as the optimum value is determined in advance.

In the present embodiment, the optimum offset value may be a value other than the central value of the upper limit offset value and lower limit offset value. For example, when the hold time should be longer than the setup time due to the characteristics of the latch circuits 66 and 68, the optimum offset value may be shifted accordingly from the central value of the upper limit offset value and lower limit offset value to optimize the setup margin and hold margin.

As a result of setting the above-described offset OFFSET to the optimum value, the setup margin and hold margin of the latch circuits 66 and 68, which latch the delay DQ signals dqeven and dqodd, those margins relating to the fall timings No. 22 and 24 of the internal clock I_CLK, are maximized, as in (1) optimum offset value in FIG. 11, and the erroneous operation of fetching the DQ signal can be inhibited.

According to the present embodiment, the DQ signal receiving circuit 21 may be provided with the offset adder 99 and the second selector 36-2, and it is not necessary to provide a circuit for detecting and setting the optimum offset value. The optimum offset value is detected and set by the CPU 12 repeatedly performing the reading operation with respect to the memory 30 in the training period.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

The invention claimed is:

1. A memory controller comprising:
   a first variable delay circuit that delays a data strobe signal received from a memory;
   a second variable delay circuit that delays a data signal which is received from the memory and is synchronous with the data strobe signal;
   a first data signal latch circuit that latches a delay data signal, which is delayed by the second variable delay circuit, in response to an internal clock;
   a phase comparator that generates a first variable delay setting value corresponding to a first delay amount of the first variable delay circuit such that a phase difference between the data strobe signal and the internal clock is reduced, and sets the first variable delay setting value to the first variable delay circuit; and
   an adder that adds to the first variable delay setting value an offset value such that a setup margin and a hold margin of the first data signal latch circuit are corrected, to generate a second variable delay setting value corresponding to a second delay amount of the second variable delay circuit, and sets the second variable delay setting value to the second variable delay circuit.

2. The memory controller according to claim 1, wherein a median value between a maximum value and a minimum value of the offset value, at which the delay data signal relating to known data and latched by the first data signal latch circuit matches the known data in a state in which the phase comparator generates the first variable delay setting value such that the phase difference is reduced, is set as the offset value.

3. The memory controller according to claim 1, wherein the internal clock has a frequency N times, N being a positive integer, that of the data strobe signal,
   the memory controller further comprising:
   a clock generator that divides the internal clock by N and generates N timing clocks at one level in a phase period from (360/N)×M to (360/N)×(M+1), M being an integer from 0 to (N−1);
   a first selector that selects a first timing clock from the N timing clocks according to a significant bit of the first variable delay setting value; and
   a second selector that selects a second timing clock from the N timing clocks according to a significant bit of the second variable delay setting value;
   the first delay amount corresponds to a lower bit of the first variable delay setting value;
   the second delay amount corresponds to a lower bit of the second variable delay setting value;
   the phase comparator detects the phase difference in a period in which the first timing clock is at the one level; and
   the first data signal latch circuit latches the delay data signal in response to the internal clock in a period of the one level of the second timing clock.

4. The memory controller according to claim 1, further comprising
   second and third data signal latch circuits each of which latches the received data signal at first and second timing edges of the data strobe signal, respectively, wherein
   the second variable delay circuit has a pair of second variable delay circuits each delaying a data signal latched by the second and third data signal latch circuits, respectively; and
   the first data signal latch circuit has a pair of first data signal latch circuits each latching a delay data signal delayed by the first and second data signal latch circuits, respectively.

5. An information processing device comprising:
   an arithmetic processing unit; and
   a memory controller that executes memory access to a memory in response to a memory access request issued by the arithmetic processing unit, wherein the memory controller includes:
   a first variable delay circuit that delays a data strobe signal received from a memory;
   a second variable delay circuit that delays a data signal which is received from the memory and is synchronous with the data strobe signal;

a first data signal latch circuit that latches a delay data signal, which is delayed by the second variable delay circuit, in response to an internal clock;

a phase comparator that generates a first variable delay setting value corresponding to a first delay amount of the first variable delay circuit such that a phase difference between the data strobe signal and the internal clock is reduced, and supplies the first variable delay setting value to the first variable delay circuit; and an adder that adds to the first variable delay setting value an offset value such that a setup margin and a hold margin of the first data signal latch circuit are corrected, to generate a second variable delay setting value corresponding to a second delay amount of the second variable delay circuit, and supplies the second variable delay setting value to the second variable delay circuit.

6. The information processing device according to claim 5, wherein the arithmetic processing unit detects a maximum value and a minimum value of the offset value at which the delay data signal relating to known data and latched by the first data signal latch circuit matches the known data in a state in which the phase comparator generates the first variable delay setting value such that the phase difference is reduced, and sets as the offset value a median value of the maximum value and the minimum value.

7. A control method for controlling a memory controller that includes a first variable delay circuit that delays a data strobe signal received from a memory; a second variable delay circuit that delays a data signal which is received from the memory and is synchronous with the data strobe signal; a first data signal latch circuit that latches a delay data signal, which is delayed by the second variable delay circuit, in response to an internal clock; and a phase comparator that generates a first variable delay setting value corresponding to a first delay amount of the first variable delay circuit such that a phase difference between the data strobe signal and the internal clock is reduced and set the first variable delay setting value to the first variable delay circuit, the method comprising:

adding to the first variable delay setting value an offset value such that a setup margin and a hold margin of the first data signal latch circuit are corrected, to generate a second variable delay setting value corresponding to a second delay amount of the second variable delay circuit; and setting the second variable delay setting value to the second variable delay circuit.

8. The method for controlling a memory controller according to claim 7, the method further comprising:

setting as the offset value a median value between a maximum value and a minimum value of the offset value, at which the delay data signal relating to known data and latched by the first data signal latch circuit matches the known data in a state in which the phase comparator generates the first variable delay setting value such that the phase difference is minimized.

* * * * *